(12) United States Patent
Huang

(10) Patent No.: US 9,214,907 B2
(45) Date of Patent: Dec. 15, 2015

(54) POWER AMPLIFYING CIRCUIT AND SYSTEM

(71) Applicant: IPGoal Microelectronics (Sichuan) Co., Ltd., Chengdu, Sichuan (CN)

(72) Inventor: Junwei Huang, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 362 days.

(21) Appl. No.: 13/857,488

(22) Filed: Apr. 5, 2013

(65) Prior Publication Data

US 2014/0126747 A1   May 8, 2014

(30) Foreign Application Priority Data

Apr. 5, 2012  (CN) .......................... 2012 1 0097868

(51) Int. Cl.
*H03F 3/217* (2006.01)

(52) U.S. Cl.
CPC ................................... *H03F 3/2173* (2013.01)

(58) Field of Classification Search
CPC ..... H03F 3/217; H03F 3/2173; H03F 3/2171; H03F 3/20; H03F 3/21; H03F 3/211; H03F 3/3022; H03F 3/68; H03F 3/72; H03F 1/34; H03F 1/0277; H03F 1/26; H03F 2200/03; H03F 2200/372; H03F 2203/21142; H03F 2203/21106; H03F 2203/7227; H03F 2203/7236
USPC ........ 381/120, 121, 108; 330/10, 251, 207 A, 330/253, 277, 291, 293
See application file for complete search history.

(56) References Cited

U.S. PATENT DOCUMENTS

| | | | | |
|---|---|---|---|---|
| 6,229,390 B1* | 5/2001 | Delano et al. | ................. | 330/107 |
| 6,396,933 B1* | 5/2002 | Jung et al. | ........................ | 381/96 |
| 6,587,670 B1* | 7/2003 | Hoyt et al. | .................... | 455/63.1 |
| 2007/0018719 A1* | 1/2007 | Seven | ............................. | 330/51 |
| 2008/0012639 A1* | 1/2008 | Mels | .............................. | 330/251 |
| 2009/0051423 A1* | 2/2009 | Miaille et al. | .................... | 330/10 |
| 2010/0130249 A1* | 5/2010 | Tam | ........................... | 455/556.1 |
| 2013/0121512 A1* | 5/2013 | Chen | ............................. | 381/121 |

OTHER PUBLICATIONS

Wolfson Microelectronics, "1W Dual-Mode Class AB/D Speaker Driver", May 2008; Rev. 3.0.*

* cited by examiner

*Primary Examiner* — Vivian Chin
*Assistant Examiner* — David Ton

(57) ABSTRACT

A power amplifying circuit includes: a signal input terminal, a common-mode voltage input terminal, a power tube control unit, a feedback loop, a driving unit, a first switching element, a second switching element, a low-pass filter, a speaker, a source voltage terminal, and a ground terminal, wherein the power tube control unit includes: an operational amplifier, a first switch, a second switch, a third switch, a fourth switch, a fifth switch, a sixth switch, a seventh switch, an eighth switch, a ninth switch, a third switching element connected with the third switch and the fourth switch, a fourth switching element connected with the fifth switch and the sixth switch, and a comparator connected with the third switching element and the fourth switching element. The present invention is able to realize functions of CLASS AB amplifier and CLASS D amplifier.

10 Claims, 2 Drawing Sheets

POWER AMPLIFYING CIRCUIT AND SYSTEM

BACKGROUND OF THE PRESENT INVENTION

1. Field of Invention

The present invention relates to an amplifying circuit and system, and more particularly to a power amplifying circuit and system, which is able to realize functions of a CLASS AB amplifier and a CLASS D amplifier.

2. Description of Related Arts

CLASS AB amplifiers and CLASS D amplifiers are two kinds of power amplifiers which are widely applied in the field of audio frequency in the conventional technology, and are both used to drive sound equipments, such as speakers, headphones, and earphones.

The CLASS AB amplifiers belong to linear amplifiers, and because the CLASS AB amplifiers have simple application, do not need overmuch external device, and have no problem of EMI (Electromagnetic Interference), the CLASS AB amplifiers are widely applied on various handheld devices. However, the CLASS AB amplifiers have low work efficiency. In an usual application, the work efficiency of the CLASS AB amplifier is only about 30%, so a majority of energy is consumed in an interior of a chip as being converted into heat, and the CLASS AB amplifier having high power usually requires for an extra cooling equipment. In the conventional technology, the CLASS AB amplifier drives a FET (field-effect tube) by an operational amplifier, to further drive the speaker.

The CLASS D amplifiers belong to switch-typed amplifiers. Because of the problem of EMI, application of the CLASS D amplifier is limited. However, the CLASS D amplifier has an advantage of high efficiency, and in the usual application, the efficiency of the CLASS D amplifier is more than 80%. In the conventional technology, the CLASS D amplifier converts an analog signal into a PWM/PDM (pulse width modulation/pulse density modulation) signal having 0 and 1 by a PWM/PDM generator, and a driver amplifies a driving ability of the PWM/PDM signal to drive the FET, and to further drive the speaker.

In order to not only play music for a long time but also receive FM signal without disturbing of EMI in application of handheld devices, such as MP3s, it is necessary to provide a power amplifying circuit and system able to realize composite functions of CLASS AB amplifier and CLASS D amplifier.

SUMMARY OF THE PRESENT INVENTION

In view of the above, it is necessary to provide a power amplifying circuit and system able to realize composite functions of CLASS AB amplifier and CLASS D amplifier.

A power amplifying circuit comprises:
a signal input terminal,
a common-mode voltage input terminal,
a power tube control unit connected with the signal input terminal and the common-mode voltage input terminal,
a feedback loop connected with the signal input terminal and the power tube control unit,
a driving unit connected with the power tube control unit,
a first switching element connected with the driving unit,
a second switching element connected with the driving unit,
a low-pass filter connected with the first switching element, the second switching element, and the feedback loop,
a speaker connected with the low-pass filter,
a source voltage terminal connected with the power tube control unit and the first switching element, and
a ground terminal connected with the power tube control unit, the second switching element, and the speaker;
wherein the power tube control unit comprises:
an operational amplifier,
a first switch connected with the operational amplifier,
a second switch connected with the operational amplifier,
a third switch connected with the operational amplifier,
a fourth switch connected with the third switch,
a fifth switch connected with the operational amplifier,
a sixth switch connected with the fifth switch,
a seventh switch connected with the first switch,
a eighth switch connected with the second switch,
a ninth switch connected with the sixth switch,
a third switching element connected with the third switch and the fourth switch,
a fourth switching element connected with the fifth switch and the sixth switch, and
a comparator connected with the third switching element and the fourth switching element.

A power amplifying system comprises:
a signal input terminal,
a common-mode voltage input terminal,
a power tube control unit connected with the signal input terminal and the common-mode voltage input terminal,
a feedback loop connected with the signal input terminal and the power tube control unit,
a driving unit connected with the power tube control unit,
a first switching element connected with the driving unit,
a second switching element connected with the driving unit,
a low-pass filter connected with the first switching element, the second switching element, and the feedback loop,
a speaker connected with the low-pass filter,
a source voltage terminal connected with the power tube control unit and the first switching element, and
a ground terminal connected with the power tube control unit, the second switching element, and the speaker, wherein the power tube control unit controls the power amplifying system to work in a switch between a CLASS AB amplifier function mode and a CLASS D amplifier function mode.

Compared to the conventional technology, the power amplifying circuit and system is able to realize the composite functions of CLASS AB amplifier and CLASS D amplifier, and doesn't occupy extra area, because a size of the power amplifying circuit and system is equal to a common CLASS D amplifier. In the present invention, the user can choose to use the CLASS D amplifier when playing music, and choose to use the CLASS AB amplifier when receiving FM and communication signal, so as to not only play the music for a long time but also receive the FM signal without disturbing of EMI.

These and other objectives, features, and advantages of the present invention will become apparent from the following detailed description, the accompanying drawings, and the appended claims.

DETAILED DESCRIPTION OF THE PREFERRED EMBODIMENT

Figure 1:
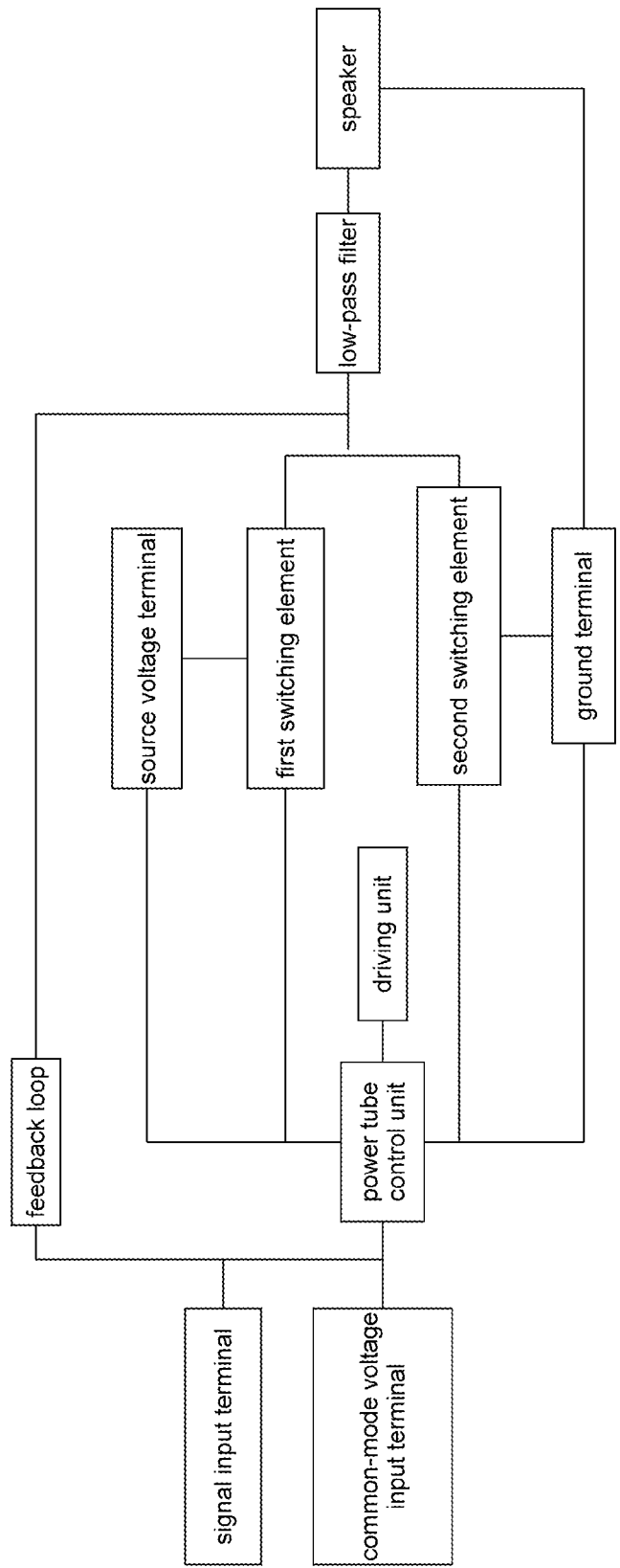
FIG. 1 is a schematic view of a system structure of a power amplifying system according to a preferred embodiment of the present invention.

Referring to FIG. 1, according to a preferred embodiment of the present invention, a power amplifying system comprises:
a signal input terminal,
a common-mode voltage input terminal,
a power tube control unit connected with the signal input terminal and the common-mode voltage input terminal,
a feedback loop connected with the signal input terminal and the power tube control unit,
a driving unit connected with the power tube control unit,
a first switching element connected with the power tube control unit,
a second switching element connected with the power tube control unit,
a low-pass filter connected with the first switching element, the second switching element, and the feedback loop,
a speaker connected with the low-pass filter,
a source voltage terminal connected with the power tube control unit and the first switching element, and
a ground terminal connected with the power tube control unit, the second switching element and the speaker.

Figure 2:
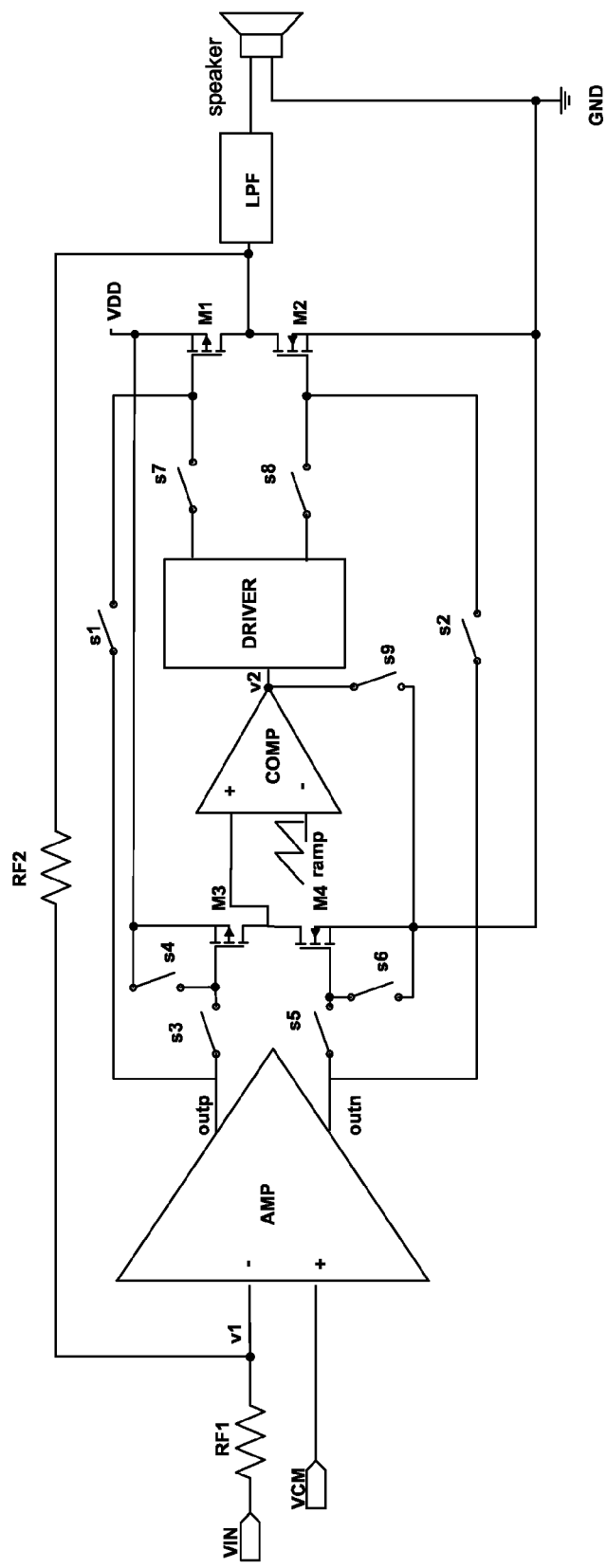
FIG. 2 is a circuit diagram of a power amplifying circuit according to the preferred embodiment of the present invention.

Referring to FIG. 2 simultaneously, FIG. 2 is a circuit diagram of a power amplifying circuit according to the preferred embodiment of the present invention, wherein the signal input terminal is embodied as a signal input terminal VIN for inputting an audio signal; the common-mode voltage input terminal is embodied as a common-mode voltage input terminal VCM for inputting an common-mode voltage; the power tube control unit comprises: an operational amplifier AMP, a first switch s1 connected with the operational amplifier AMP, a second switch s2 connected with the operational amplifier AMP, a third switch s3 connected with the operational amplifier AMP, a fourth switch s4 connected with the third switch s3, a fifth switch s5 connected with the operational amplifier AMP, a sixth switch s6 connected with the fifth switch s5, a seventh switch s7 connected with the first switch s1, an eighth switch s8 connected with the second switch s2, a ninth switch s9 connected with the sixth switch s6, a third switching element connected with the third switch s3 and the fourth switch s4, a fourth switching element connected with the fifth switch s5 and the sixth switch s6, and a comparator COMP connected with the third switching element and the fourth switching element, wherein the power tube control unit controls the power amplifying circuit and system to switch between a CLASS AB amplifier function working status and a CLASS D amplifier function working status; the feedback loop comprises: a first resistor RF1, and a second resistor RF2 connected with the first resistor RF1, the feedback loop is for adjusting the volume of the speaker; the driving unit is embodied as a driver DRIVER, for driving the speaker to work normally; the low-pass filter is embodied as a low-pass filter LPF, for preventing high-frequency signals from pass and allowing low-frequency signals to pass. In the preferred embodiment, the first switching element is embodied as a first FET M1, the second switching element is embodied as a second FET M2, the third switching element is embodied as a third FET M3, the fourth switching element is a fourth FET M4; in other embodiments, the switching elements can be embodied as other switching elements or switching circuits able to realize same functions; the source voltage terminal is embodied as a source voltage terminal VDD; the ground terminal is embodied as a ground terminal GND.

Specific circuit connection relations of the power amplifying circuit are described as followed. The signal input terminal VIN is connected with a first end of the first resistor RF1, a second end of the first resistor RF1 is connected with a first end of the second resistor RF2 and an inverting input node of the operational amplifier AMP, the common-mode voltage input terminal VCM is connected with a non-inverting input node of the operational amplifier AMP, a non-inverting output node outp is connected with a first end of the first switch s1 and a first end of the third switch s3, a second end of the first switch s1 is connected with a first end of the seventh switch s7 and a gate electrode of the first FET M1, a second end of the third switch s3 is connected with a first end of the fourth switch s4 and a gate electrode of the third FET M3. The inverting output node outn of the operational amplifier AMP is connected with a first end of the second switch s2 and a first end of the fifth switch s5, a second end of the second switch s2 is connected with a first end of the eighth switch s8 and a gate electrode of the second FET M2, a second end of the fifth switch s5 is connected with a first end of the sixth switch s6 and a gate electrode of the fourth FET M4. A drain electrode of the third FET M3 and a drain electrode of the fourth FET M4 are jointly connected with a non-inverting input node of the comparator COMP, an inverting input node of the comparator COMP is for receiving a triangle wave signal ramp, an output nod of the comparator COMP is connected with an input terminal of the driver DRIVER and a first end of the ninth switch s9. A first output terminal of the driver DRIVER is connected with a second end of the seventh switch s7, a second output terminal of the driver DRIVER is connected with a second end of the eighth switch s8. A drain electrode of the first FET M1, a drain electrode of the second FET M2 and a second end of the second resistor RF2 are jointly connected with an input terminal of the low-pass filter LPF, an output terminal of the low-pass filter LPF is connected with a first input terminal of the speaker. A source electrode of the first FET M1, a source electrode of the third FET M3, and a second end of the fourth switch s4 are jointly connected with the source voltage terminal VDD, the source electrode of the second FET M2, the source electrode of the fourth FET M4, a second end of the sixth switch s6, a second end of the ninth switch s9 and a second input terminal of the speaker are jointly connected with the ground terminal GND.

A working principle of the power amplifying circuit and system is described as followed.

When the power amplifying circuit and system works in a CLASS D amplifier function mode, the power tube control unit will receive a first choice controlling signal for switching the power amplifying circuit and system to the CLASS D amplifier function mode, switching off the first switch s1, the second switch s2, the fourth switch s4, the sixth switch s6 and the ninth switch s9, and switching on the third switch s3, the fifth switch s5, the seventh switch s7 and the eighth switch s8. At this time, signals outputted from the non-inverting output node outp and the inverting output node outn of the operational amplifier AMP drive the third FET M3 and the fourth FET M4 instead of driving the first FET M1 and the second FET M2 directly. The third FET M3 and the fourth FET M4 output a controlling signal to the comparator COMP. After the comparator COMP compares the signal received with the triangle wave signal ramp, the comparator COMP generates a PWM signal and transmit the PWM signal to a voltage terminal V2, a voltage of the voltage terminal V2 drives the first FET M1 and the second FET M2 by the driver DRIVER, in such a manner that the speaker is driven by amplifying the power.

When the power amplifying circuit and system works in a CLASS AB amplifier function mode, the power tube control unit will receive a second choice controlling signal for switching the power amplifying circuit and system to the CLASS AB amplifier function mode, switching on the first switch s1, the second switch s2, the fourth switch s4, the sixth switch s6 and the ninth switch s9, and switching off the third switch s3, the fifth switch s5, the seventh switch s7 and the eighth switch s8. At this time, the voltage terminal V2 is connected with the ground terminal GND, and the driver DRIVER is disconnected from the first FET M1 and the second FET M2, and the non-inverting output node outp and the inverting output node outn of the operational amplifier AMP is disconnected from the third FET M3 and the fourth FET M4, in such a manner that the operational amplifier AMP drives the first FET M1 and the second FET M2 directly, and the speaker is driven by amplifying the power.

In the present invention, the power amplifying circuit and system is able to realize the composite functions of CLASS AB amplifier and CLASS D amplifier, and doesn't occupy extra area, because a size of the power amplifying circuit and system is the same as a common CLASS D amplifier. In the present invention, a user can choose to use the CLASS D amplifier when playing music, and choose to use the CLASS AB amplifier when receiving FM and communication signal, so as to not only play the music for a long time but also receive the FM signal without disturbing of EMI.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A power amplifying circuit, comprising:
   a signal input terminal,
   a common-mode voltage input terminal,
   a power tube control unit connected with said signal input terminal and said common-mode voltage input terminal,
   a feedback loop connected with said signal input terminal and said power tube control unit,
   a driving unit connected with said power tube control unit,
   a first switching element connected with said power tube control unit,
   a second switching element connected with said power tube control unit,
   a low-pass filter connected with said first switching element, said second switching element, and said feedback loop,
   a speaker connected with said low-pass filter,
   a source voltage terminal connected with said power tube control unit and said first switching element, and
   a ground terminal connected with said power tube control unit, said second switching element, and said speaker,
   wherein said power tube control unit comprises:
   an operational amplifier,
   a first switch connected with said operational amplifier,
   a second switch connected with said operational amplifier,
   a third switch connected with said operational amplifier,
   a fourth switch connected with said third switch,
   a fifth switch connected with said operational amplifier,
   a sixth switch connected with said fifth switch,
   a seventh switch connected with said first switch,
   a eighth switch connected with said second switch,
   a ninth switch connected with said sixth switch,
   a third switching element connected with said third switch and said fourth switch,
   a fourth switching element connected with said fifth switch and said sixth switch, and
   a comparator connected with said third switching element and said fourth switching element.

2. The power amplifying circuit, as recited in claim 1, wherein said feedback loop comprises: a first resistor connected with said signal input terminal and a second resistor connected with said first resistor, said first switching element is embodied as a first FET, said second switching element is embodied as a second FET, said third switching element is embodied as a third FET, and said fourth switching element is a fourth FET.

3. The power amplifying circuit, as recited in claim 2, wherein said signal input terminal is connected with a first end of said first resistor, a second end of said first resistor is connected with a first end of said second resistor and an inverting input node of said operational amplifier, said common-mode voltage input terminal is connected with a non-inverting input node of said operational amplifier.

4. The power amplifying circuit, as recited in claim 3, wherein said non-inverting output node of said operational amplifier is connected with a first end of said first switch and a first end of said third switch, a second end of said first switch is connected with a first end of said seventh switch and a gate electrode of said first FET, a second end of said third switch is connected with a first end of said fourth switch and a gate electrode of said third FET, said inverting output node of said operational amplifier is connected with a first end of said second switch and a first end of said fifth switch, a second end of said second switch is connected with a first end of said eighth switch and a gate electrode of said second FET, and a second end of said fifth switch is connected with a first end of said sixth switch and a gate electrode of said fourth FET.

5. The power amplifying circuit, as recited in claim 4, wherein a drain electrode of said third FET and a drain electrode of said fourth FET are jointly connected with a non-inverting input node of said comparator, an inverting input node of said comparator is for receiving a triangle wave signal, and an output node of said comparator is connected with an input terminal of said driving unit and a first end of said ninth switch.

6. The power amplifying circuit, as recited in claim 5, wherein a first output terminal of said driving unit is connected with a second end of said seventh switch, a second output terminal of said driving unit is connected with a second end of said eighth switch, a drain electrode of said first FET, a drain electrode of said second FET and a second end of said second resistor are jointly connected with an input terminal of said low-pass filter, an output terminal of said low-pass filter is connected with an input terminal of said speaker.

7. The power amplifying circuit, as recited in claim 6, wherein a source electrode of said first FET, a source electrode of said third FET, and a second end of said fourth switch are jointly connected with said source voltage terminal, said source electrode of said second FET, said source electrode of said fourth FET, a second end of said sixth switch, a second end of said ninth switch and a second input terminal of said speaker are jointly connected with said ground terminal.

8. A power amplifying system, comprising:
   a signal input terminal,
   a common-mode voltage input terminal, a power tube control unit connected with said signal input terminal and said common-mode voltage input terminal,
a feedback loop connected with said signal input terminal and said power tube control unit,
a driving unit connected with said power tube control unit,
a first switching element connected with said power tube control unit,
a second switching element connected with said power tube control unit,
a low-pass filter connected with said first switching element, said second switching element, and said feedback loop,
a speaker connected with said low-pass filter,
a source voltage terminal connected with said power tube control unit and said first switching element, and
a ground terminal connected with said power tube control unit, said second switching element and said speaker, wherein said power tube control unit controls said power amplifying system to work in a switch between a CLASS AB amplifier function mode and a CLASS D amplifier function mode.

9. The power amplifying system, as recited in claim 8, wherein said power tube control unit comprises:
an operational amplifier,
a first switch connected with said operational amplifier,
a second switch connected with said operational amplifier,
a third switch connected with said operational amplifier,
a fourth switch connected with said third switch,
a fifth switch connected with said operational amplifier,
a sixth switch connected with said fifth switch,
a seventh switch connected with said first switch,
a eighth switch connected with said second switch,
a ninth switch connected with said sixth switch,
a third switching element connected with said third switch and said fourth switch,
a fourth switching element connected with said fifth switch and said sixth switch, and
a comparator connected with said third switching element and said fourth switching element.

10. The power amplifying system, as recited in claim 9, wherein said feedback loop comprises: a first resistor connected with said signal input terminal and a second resistor connected with said first resistor, said first switching element is embodied as a first FET, said second switching element is embodied as a second FET, said third switching element is embodied as a third FET, and said fourth switching element is a fourth FET.

* * * * *